(12) United States Patent
Van Hattum

(10) Patent No.: US 11,647,620 B2
(45) Date of Patent: May 9, 2023

(54) NONWOVEN FABRIC FOR SHIELDING TERAHERTZ FREQUENCIES

(71) Applicant: SZE Hagenuk GmbH, Kiel (DE)

(72) Inventor: Edgar-Johannes Van Hattum, Bergen (DE)

(73) Assignee: ZE Hagenuk GmbH

( * ) Notice: Subject to any disclaimer, the term of this patent is extended or adjusted under 35 U.S.C. 154(b) by 409 days.

(21) Appl. No.: 16/644,584

(22) PCT Filed: Sep. 8, 2017

(86) PCT No.: PCT/EP2017/072634
§ 371 (c)(1),
(2) Date: Mar. 5, 2020

(87) PCT Pub. No.: WO2019/048056
PCT Pub. Date: Mar. 14, 2019

(65) Prior Publication Data
US 2021/0068318 A1  Mar. 4, 2021

(51) Int. Cl.
| | | |
|---|---|---|
| *D04H 1/4234* | (2012.01) | |
| *D04H 1/4242* | (2012.01) | |
| *D04H 3/011* | (2012.01) | |
| *D01D 5/00* | (2006.01) | |
| *D04H 1/413* | (2012.01) | |
| *D06M 11/83* | (2006.01) | |
| *H05K 9/00* | (2006.01) | |
| *C22C 38/04* | (2006.01) | |
| *C22C 38/00* | (2006.01) | |
| *C22C 5/04* | (2006.01) | |
| *C22C 14/00* | (2006.01) | |
| *C22C 19/07* | (2006.01) | |
| *B22F 9/12* | (2006.01) | |
| *C22C 47/04* | (2006.01) | |
| *D01D 1/02* | (2006.01) | |

(52) U.S. Cl.
CPC ............. *H05K 9/009* (2013.01); *B22F 9/12* (2013.01); *C22C 5/04* (2013.01); *C22C 14/00* (2013.01); *C22C 19/07* (2013.01); *C22C 38/004* (2013.01); *C22C 38/04* (2013.01); *C22C 47/04* (2013.01); *D01D 1/02* (2013.01); *D01D 5/0015* (2013.01); *D04H 1/413* (2013.01); *D04H 1/4234* (2013.01); *D04H 1/4242* (2013.01); *D04H 3/011* (2013.01); *D06M 11/83* (2013.01); *B22F 2301/35* (2013.01); *B22F 2302/45* (2013.01); *D10B 2101/20* (2013.01); *D10B 2401/22* (2013.01)

(58) Field of Classification Search
CPC ....... H05K 9/009; B22F 9/12; B22F 2301/35; B22F 2302/45; C22C 5/04; C22C 14/00; C22C 19/07; C22C 38/004; C22C 38/04; C22C 47/04; D01D 1/02; D01D 5/0015; D04H 1/413; D04H 1/4234; D04H 1/4242; D04H 3/011; D04H 3/005; D04H 1/04; D06M 11/83; D10B 2101/20; D10B 2401/22

See application file for complete search history.

(56) References Cited

U.S. PATENT DOCUMENTS

| | | | |
|---|---|---|---|
| 4,943,477 A | 7/1990 | Kanamura et al. | |
| 9,233,517 B2* | 1/2016 | Kato | D04H 5/06 |
| 2012/0289107 A1 | 11/2012 | Beissinger et al. | |
| 2016/0369400 A1* | 12/2016 | Maxwell | C04B 35/58028 |

FOREIGN PATENT DOCUMENTS

| | | |
|---|---|---|
| CA | 2645531 A1 | 5/2010 |
| DE | 202006011912 U1 | 1/2007 |
| JP | 2011241522 A | 12/2011 |

OTHER PUBLICATIONS

European International Search Report for PCT/EP2017/072634 dated Apr. 30, 2018.

* cited by examiner

*Primary Examiner* — Elizabeth M Imani
(74) *Attorney, Agent, or Firm* — Carlson, Gaskey & Olds, P.C.

(57) ABSTRACT

A method for producing a nonwoven for shielding electromagnetic radiation in a terahertz (THz) range includes: providing a first metal alloy adapted to shield electromagnetic radiation; providing a polymer material; providing a second metal alloy which differs from the first metal alloy; producing polymer fibers with filled fiber cores by evaporating the first metal alloy and mixing the first metal alloy molecules with the polymer material; coating at least a part of a surface of the polymer fibers with the second metal alloy; producing the nonwoven by randomly and irregularly arranging the coated polymer fibers with filled fiber cores in a three spatial dimensional directions, or producing the nonwoven by randomly and irregularly arranging the polymer fibers with filled fiber cores in the three spatial dimensional directions and coating at least a part of a surface of the nonwoven with the second metal alloy.

39 Claims, 4 Drawing Sheets

NONWOVEN FABRIC FOR SHIELDING TERAHERTZ FREQUENCIES

CROSS-REFERENCE TO RELATED APPLICATIONS

This application is the US national phase of PCT/EP2017/072634 which was filed on Sep. 8, 2017.

TECHNICAL FIELD

The present disclosure relates to a method for producing a nonwoven for shielding electromagnetic radiation, in particular frequencies in the terahertz (THz) range, more particularly from 5 THz to 300 THz, to a corresponding nonwoven that can be produced using the method according to the disclosure, and to applications for said nonwoven.

BACKGROUND

Electromagnetic radiation consists of coupled electric and magnetic fields. It includes, among others, radio waves microwaves, infrared radiation, visible light, UV radiation, as well as X-radiation and gamma radiation.

Terahertz (Thz) radiation is electromagnetic radiation at a frequency of about $10^{12}$ hertz. In the electromagnetic spectrum, terahertz radiation is located between the visible light and the microwave region and used to be referred to as far infrared.

Electromagnetic waves in the terahertz range constitute a non-ionizing electromagnetic radiation (abbreviated as terahertz radiation or terahertz rays, or terahertz frequencies). Non-ionizing means that the energy of a terahertz photon is too small to remove electrons from atoms or molecules.

An increased terahertz radiation is measured, for example, in airplanes at cruising altitude as well as in the region of power poles for high and medium voltage or transformer stations where the electrical energy from the medium voltage grid is converted (transformed) for a low voltage grid.

Currently, terahertz rays can be shielded using, for example, lead materials, in particular lead vests for persons. However, these lead materials have a relatively high weight and are relatively rigid and have a low breathability.

Suitable materials need to be provided for shielding electromagnetic radiation, in particular terahertz radiation, which are easier to process than lead materials and in particular have a relatively low weight and/or are relatively flexible and/or breathable.

SUMMARY

Advantageous configurations of the present disclosure are presented in the claims and the following description and the figures.

Accordingly, a first subject matter of the present disclosure relates to a method for producing a nonwoven for shielding electromagnetic radiation (electromagnetic waves), in particular terahertz (THz) radiation, more particularly in the range from 5 THz to 300 THz, comprising or consisting of a network of coated polymer fibers with filled fiber cores that is arranged randomly and irregularly in three dimensional directions (X, Y, and Z) of said nonwoven, wherein the method comprises or consists of the following steps:

a. providing a first metal alloy adapted to shield electromagnetic radiation, in particular in the terahertz (THz) range, more particularly from 5 THz to 300 THz, b. providing a polymer material, c. providing a second metal alloy which differs from the first metal alloy of step a) in that a charge potential difference can be effected between the first and second metal alloys, d. producing polymer fibers with filled fiber cores by evaporating the first metal alloy of step a) into first metal alloy molecules having a trigonal structure and mixing the first metal alloy molecules with the polymer material provided in step b) as well as arranging the metalized polymer material in fiber form, wherein the first metal alloy molecules having a trigonal structure are essentially arranged inside the core of the polymer fiber and form a lattice in which the individual first metal alloy molecules are each isolated by the polymer but overlie the electron clouds of the adjacent first metal alloy molecules, and e. coating at least a part of the surface of the polymer fibers with filled fiber cores of step d) with the second metal alloy of step c), wherein the second metal alloy is evaporated into individual second metal alloy molecules having a hexagonal or octagonal structure which are arranged on the polymer fiber surface isolated from one another and form a surface lattice in which the electron clouds of the individual second metal alloy molecules overlie one another, and producing the nonwoven by randomly and irregularly arranging the coated polymer fibers with filled fiber cores in said three orthogonal spatial dimensional directions (X, Y, and Z), or f. producing the nonwoven by randomly and irregularly arranging the polymer fibers with filled fiber cores of step d) in the three orthogonal spatial dimensional directions (X, Y, and Z) and coating at least a part of the surface of the nonwoven with the second metal alloy of step c), wherein the second metal alloy is evaporated into individual second metal alloy molecules having a hexagonal or octagonal structure which are arranged on the polymer fiber surface isolated from one another and form a surface lattice in which the electron clouds of the individual second metal alloy molecules overlie one another.

A second subject matter of the present disclosure relates to a nonwoven for shielding electromagnetic radiation, in particular terahertz radiation, more particularly in the range from 5 THz to 300 THz, which can be produced using the method according to the disclosure.

A third subject matter of the present disclosure relates to the use of the nonwoven according to the disclosure for shielding electromagnetic radiation, in particular terahertz radiation, more particularly in the range from 5 THz to 300 THz.

A fourth subject matter of the present disclosure relates to the use of the nonwoven according to the disclosure for producing protective suits for humans or animals.

A fifth subject matter of the present disclosure relates to the use of the nonwoven according to the disclosure for shielding buildings, vehicles (on the land, waterborne, and/or airborne), objects and pathways.

A sixth subject matter of the present disclosure relates to the use of the nonwoven according to the disclosure for producing polymer insulations of openings in buildings or (land, waterborne, and/or airborne) vehicles or pathways.

To the extent deemed appropriate by a person skilled in the art, the subject matters described above may include any possible combination of features of the preferred configurations of the disclosure as disclosed below and in particular also in the dependent claims.

BRIEF DESCRIPTION OF THE DRAWINGS

The features and aspects of the disclosure are explained in more detail below based on embodiment examples and with reference to the figures, in which.

DETAILED DESCRIPTION

Figure 1:
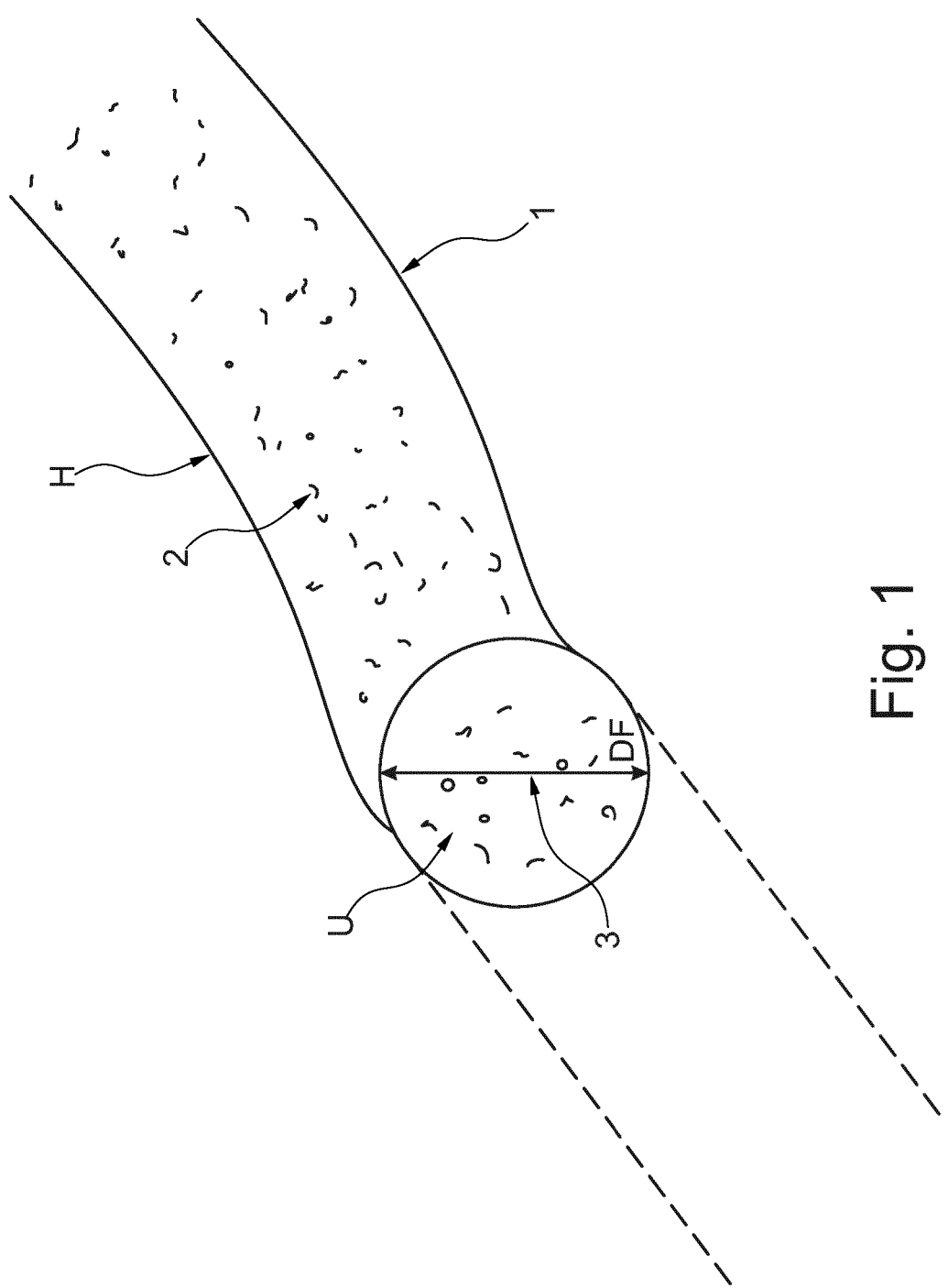
FIG. 1: shows a simplified perspective view of a fiber of a nonwoven with a cross section through the fiber according an embodiment example.

FIG. 1 is a simplified perspective view of a fiber or polymer fiber 1 of a nonwoven 4 according to the disclosure with a cross section through the fiber 1 according an embodiment example. The fiber has a length L and a diameter DF. Second metal alloy molecules 2 are arranged on the surface H of the fiber 1. First metal alloy molecules 3 are arranged inside the core (or simply in the interior) K of the fiber 1.

Figure 2:
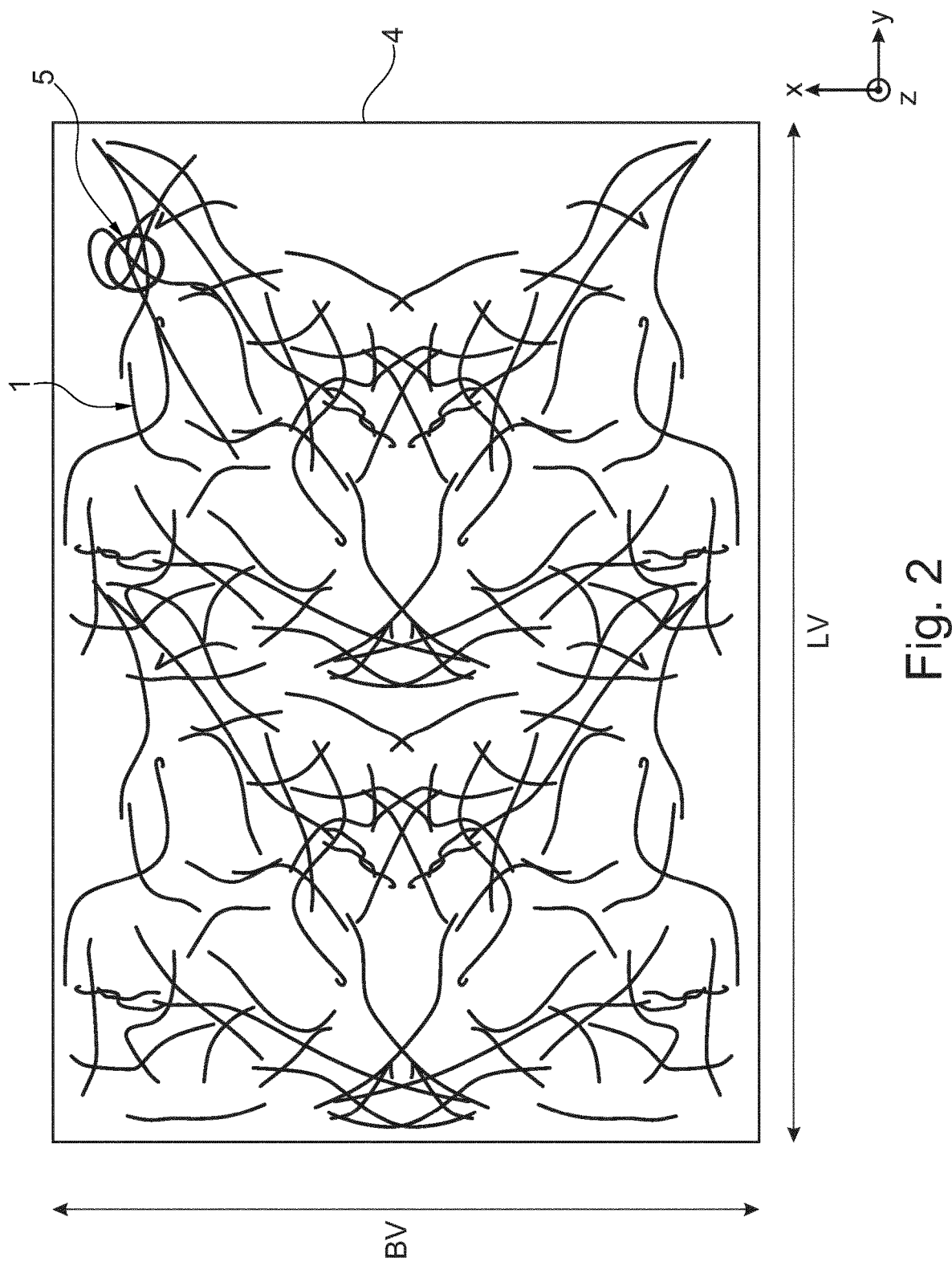
FIG. 2: shows a top view of a nonwoven according an embodiment example.

FIG. 2 is a top view of a nonwoven 4 according an embodiment example disclosure. The nonwoven 4 is comprised of randomly and irregularly arranged fibers 1 as shown, for example, in FIG. 1. The fibers 1 extend irregularly in all three spatial directions X, Y, and Z. The fibers 1 may have one or more bends in one or more of said spatial directions X, Y, and Z. The fibers 1 may be interconnected at crossing points or connection points 5. Such a connection point 5 is exemplified by a circle. It is also conceivable that the fibers 1 are merely randomly and irregularly entangled and merely contact one another at said crossing points. The nonwoven may have a length LV in the Y direction, a width BV in the X direction, and a height or strength or thickness (layer thickness) DV in the Z direction (not shown here). The overall length LV and width BV of the nonwoven 4 are typically substantially larger than the thickness DV. As a result, the nonwoven 4 is shaped, through further conventional consolidation steps where appropriate, into an essentially flat textile which can be used for applications on the human or animal body, on or inside (land, waterborne, and/or airborne) vehicles, on or inside buildings, etc.

According to the present disclosure, the term "vehicles" comprises any kind of land, waterborne, and/or airborne mode of transportation. In other words, land vehicles comprise in particular motor vehicles such as, for example, cars, trucks, or motorcycles, as well as bicycles, etc. Waterborne vehicles comprise motorized and non-motorized vehicles such as, for example, ships, boats, jet ski, surfboards, etc. Airborne vehicles comprise motorized and non-motorized vehicles such as airplanes, helicopters, airships (zeppelins), balloons carrying passengers, etc. These vehicles may be manned or move autonomously.

In the context of the present disclosure, the term "nonwoven" or "nonwoven material" 4 generally refers to a nonwoven fabric (commonly referred to as "nonwoven") which is a structure made of fibers 1 of limited length, continuous fibers (filaments), or cut fibers 1, which have respectively been combined in a suitable manner so as to form a nonwoven 4 (fibrous layer or card web). In the context of the present disclosure, the term "nonwoven" 4 refers to both unconsolidated nonwoven (also called "fibrous nonwoven") and consolidated nonwoven (also called "nonwoven fabrics"). In general, the following relationship applies: the higher the degree of consolidation of the nonwoven the smaller the gaps between the fibers, and the better the shielding of higher-frequency radiation, in particular in the terahertz range. The nonwoven 4 according to the disclosure is preferably a nonwoven consolidated using conventional processes, i.e. a consolidated nonwoven fabric, to shield terahertz radiation. This is to be distinguished, although only to the extent that the effects described herein are likewise but less effectively achieved, from crossing or entangling yarns as done in weaving, knitting, lacing, braiding, and the production of tufted goods.

What is important for the present disclosure is the random and irregular arrangement and extension of the fibers 1 in the spatial dimensions X, Y, and Z.

The nonwoven 4 according to the disclosure, which comprises the polymer fibers 1, is, for example, a largely flexible, sheetlike textile structure, i.e. it can be flexed easily. In the present case, the nonwoven 4 according to the disclosure consists at least predominantly, or also exclusively where appropriate, of the polymer fibers 1, which have a relatively small thickness compared to their length and width. However, it is also possible to produce nonwovens 4 according to the disclosure with relatively large thickness, which are to be assigned to spatial structures (e.g. nonwoven fabrics for insulating materials and upholstery materials). The present disclosure is suitable for such applications as well. Alternatively or cumulatively, and depending on the application, two, three or more nonwovens 4 according to the disclosure may be stacked or a nonwoven 4 may be folded several times to achieve suitable shielding for a corresponding magnetic radiation.

The nonwoven according to the disclosure may be produced using conventional production methods for nonwoven materials. A classification of the production methods suitable for the present disclosure can be taken from the standard DIN 61 210 issued by the German Institute for Standardization.

Accordingly, mechanically formed nonwovens which are made of card webs taken from carders and stacked to form nonwovens or formed directly by these carding machines are suitable for the present disclosure. These are generally nonwovens made of spinning fibers.

According to the disclosure, aerodynamically formed nonwovens which are formed from fibers on an air-permeable surface using an airflow are alternatively also suitable for the present disclosure. If the nonwovens are formed from spinning fibers or short cut fibers and fluff pulp, they are called dry-laid nonwovens. Generally, random-laid nonwovens and, upon corresponding consolidation, dry-laid nonwoven or random-laid nonwoven fabrics are created.

Alternatively, nonwovens consisting of fibers that are spun directly from polymer melts passing through nozzles are also suitable.

If the fibers spun from polymer melts passing through nozzles are stretched using hot airflows until rupture and formed by direct depositing, so-called meltblown nonwovens are created. They mostly consist of longer portions of continuous fiber similar to spinning fiber, but also of a combination with continuous fibers or completely of continuous fibers. The resulting consolidated nonwovens are mostly referred to as meltblown nonwovens.

If the fibers spun from polymer melts passing through nozzles are stretched using cold air and/or mechanically and formed by direct depositing, they are referred to as spunlaid or spunbonded nonwovens or, after consolidation, nonwoven fabrics. These nonwovens are created exclusively from filaments or continuous fibers.

Alternatively, meltblown nonwoven layers may be combined with spunlaid nonwoven layers to create, for example, spunlaid-meltblown-spunlaid (SMS) nonwoven structures. The layered structure provides higher strength compared to single-fiber nonwovens.

Alternatively, hydrodynamically formed nonwovens are also suitable for the present disclosure. For hydrodynamically formed nonwovens, the fibers are suspended in water and deposited on a water-permeable surface. If shorter spinning fibers or fluff pulp are used, the nonwovens are referred to as wet-laid nonwovens. In the subsequent consolidated state, they are referred to wet-laid nonwoven fabrics. The process is frequently also referred to as wet process. If continuous fibers directly spun from polymer solutions, and optionally extended, are deposited so as to form a nonwoven using water, wet-spunlaid nonwovens or, in consolidated form, wet-spunlaid nonwoven fabrics.

Electrostatically formed nonwovens having fibers that are formed from polymer solutions or melts and deposited under the influence of an electric field are also suitable. This creates so-called ultrafine fiber nonwovens or nanofiber nonwovens.

According to one exemplary disclosure, it is also possible to use combinations of the aforesaid nonwoven production processes. In one example, a combination of spunlaid and electrostatic nonwoven production processes is preferred. The metalized polymer material is in this case introduced into an electric field, preferably in drop form, and drawn so as to form a polymer fiber 1 while a preferably oxygen-free gas colder than the polymer material is supplied. The combination has the advantage that said e-spinning produces a fiber 1 in which the first metal alloy molecules 3 are predominantly arranged inside the fiber 1, and the polymer fiber 1 is cooled and solidified correspondingly through the supply of colder and preferably oxygen-free gas.

An alternative and frequently used classification of the processes suitable for forming nonwovens according to the disclosure relates to the classification according to dry, wet, and extrusion processes.

In this case, the aforementioned mechanical and aerodynamic processes for forming nonwovens based on spinning fibers are classified as dry processes.

The hydrodynamic process for forming nonwovens based on spinning fibers is classified as a wet process.

According to previous classifications, the extrusion processes for forming nonwovens only comprised processes based on polymer melts, meltblown nonwovens and spunlaid nonwovens made of continuous fibers, the formation of ultrafine fiber nonwovens through electrospinning and the formation of film fiber nonwovens created through fibrillation of extruded films. According to newer systematics, the nonwovens formed through extrusion also comprise the formation of nonwovens by fibers formed directly from polymer solutions using the electrostatic spinning process or the so-called flash spinning process (flash evaporation spunlaid nonwoven process).

The combination of extrusion process and electrostatic spinning process, which is preferred according to the disclosure, is also classified as a wet process.

The produced fibrous nonwoven is usually consolidated mechanically, chemically and/or thermally, such that a firmer bond is then obtained between the fibers compared to the originally produced fibrous nonwoven. A corresponding consolidation reduces the spacing of the polymer fibers 1 in the nonwoven. The smaller the spacing or gaps between the fibers the better the shielding effect also for higher-frequency radiation, in particular terahertz radiation and radiation with even higher frequencies.

In the mechanical consolidation process, the bond between the fibers is created through frictional contact or a combination of frictional and interlocking contact. In the case of frictional contact, the spacing of the adjacent fibers is reduced compared to that in the spunlaid nonwoven through densification of the nonwoven. This increases the mutual adhesion between the fibers, so that higher forces can be transferred. The resistance of the nonwoven against deformation is increased and it becomes more solid.

The densification may alternatively be achieved by shrinking a part or all of the fibers if the fibers are shrinkable when subjected to heat and/or a swelling agent. The result are shrunk or swollen nonwovens.

The densification may also be achieved by pressing (mostly calendering).

According to an embodiment of the present disclosure, the nonwoven is pressed through a roller system, such that consolidation is obtained using forces larger than or equal to 0.1 bar, preferably larger than or equal to 0.2 bar, 0.3 bar, 0.4 bar, 0.5 bar, 0.6 bar, 0.7 bar, 0.8 bar, 0.9 bar, 1.0 bar, 1.1 bar, 1.2 bar, 1.3 bar, 1.4 bar, 1.5 bar, 1.6 bar, 1.7 bar, 1.8 bar, or more. According to a preferred configuration, this roller system is combined with a heating system, so that the nonwoven is dried during consolidation. The roller system is preferably heated to temperatures below 70° C., preferably in the range between 40° C. and 65° C. The nonwoven consolidated according to the disclosure preferably has a moisture content of 20%, and more preferably 10%.

The mechanical consolidation may alternatively be performed by fulling, in which process the fibers need to be capable of felting and become felted among each other through simultaneous thermal, chemical and mechanical influences. The fulling creates felts or fulled nonwoven fabrics.

Needled nonwoven materials in which the entanglement of the fibers and thus the densification and consolidation of the nonwoven is performed through needling, which involves piercing with a plurality of special needles (barbed needles, fork needles) arranged in a needle board or bar, are less suitable for the disclosure since the needling creates uniform holes and thus gaps are introduced into the nonwoven which can reduce the shielding effect.

Alternatively or cumulatively, the nonwovens according to the disclosure may be consolidated through chemical consolidation processes which create the fiber bond through material contact using additives (synonymously called "adhesive bond"). According to the disclosure, however, such a chemical consolidation is advantageously not applied since the binder itself has no shielding effect and the additional binders may cause the formation of larger spaces between the metal alloy molecules and thus reduce the shielding effect.

In the case of thermal consolidation processes for nonwovens according to the disclosure, the fiber bond is likewise created through material contact, with a further distinction often being made between adhesive and cohesive bonding. This requires thermoplastic auxiliary components or thermoplastic fibers. In the case of adhesive consolidation, binders in solid form are added to the nonwoven as fibers (single-component fiber with lower melting point than the main component fiber or bi- or multicomponent fiber, wherein a component at the surface preferably has a lower melting point than the other components). Through a thermal treatment, e.g. through hot air perfusion (thermobonding) or thermocalendering using engraved or even rollers, where pressure is simultaneously applied in addition to heat, the thermal binder is brought into a sticky liquid state, so that it creates a firm bond with the main fiber component of the nonwoven.

In the case of cohesive consolidation, thermoplastic fibers of a same raw material are bonded to form nonwovens according to the disclosure without an additional binder. The fibers are welded together through temporary influence of an increased temperature, which causes the fibers to soften and adjacent fibers to interconnect at the contact points. The connection is very often made under simultaneous influence of pressure. Cohesive consolidation is advantageously suitable when lightweight fibrous nonwovens or lightweight spunlaid nonwovens are consolidated, for example, through heated embossing calenders or through ultrasonic welding systems.

While the individual polymer fibers 1 are arranged in the nonwoven 4 according to the disclosure randomly and inhomogenously, i.e. irregularly, in the X, Y and Z directions of space on a micrometer scale, the nonwoven according to the disclosure in its entirety forms a homogenous fiber structure in a three-dimensional view. When electromagnetic radiation/waves impinge on the nonwoven material according to the disclosure, static fields (positive and negative charges in the fibers) are initially formed on a micrometer scale which, however, cancel each other out almost completely on a decimeter scale across the entire nonwoven. In other words, in the passage direction (see reference vector S in FIG. 4 below), i.e. perpendicular to the plane of extension of the nonwoven 4, the nonwoven 4 should have no or only such passage openings which are very small relative to the wavelength of the radiation to be absorbed. At 5 THz, for example, this would be a wavelength $\lambda$ of 0.2 mm or 200 µm. Accordingly, a suitable nonwoven should advantageously not have any passage openings in the order of magnitude of the wavelength of the radiation to be absorbed. In the present example (5 THz), the maximum diameter DO (not shown) of a passage opening should be much smaller than the wavelength $\lambda$ of the radiation to be absorbed, thus DO<<$\lambda$ or DO<<0.2 mm. At higher frequencies, the corresponding wavelengths are shorter which means that the nonwoven must have a correspondingly higher density. Further, the nonwoven should also have spaces AK between the contact points of the fibers 1 that are small compared to the wavelength $\lambda$ of the radiation to be absorbed (AK<<$\kappa$). For a frequency range from 5 THz to 300 THz, the relationship should thus be DO, AK<<3.3 µm. The nonwoven may advantageously be densified or structured such that there are virtually no passage openings and the contact points between the fibers are located very close. The nonwoven is thus also suitable for electromagnetic radiation in much higher frequency ranges.

Figure 3:
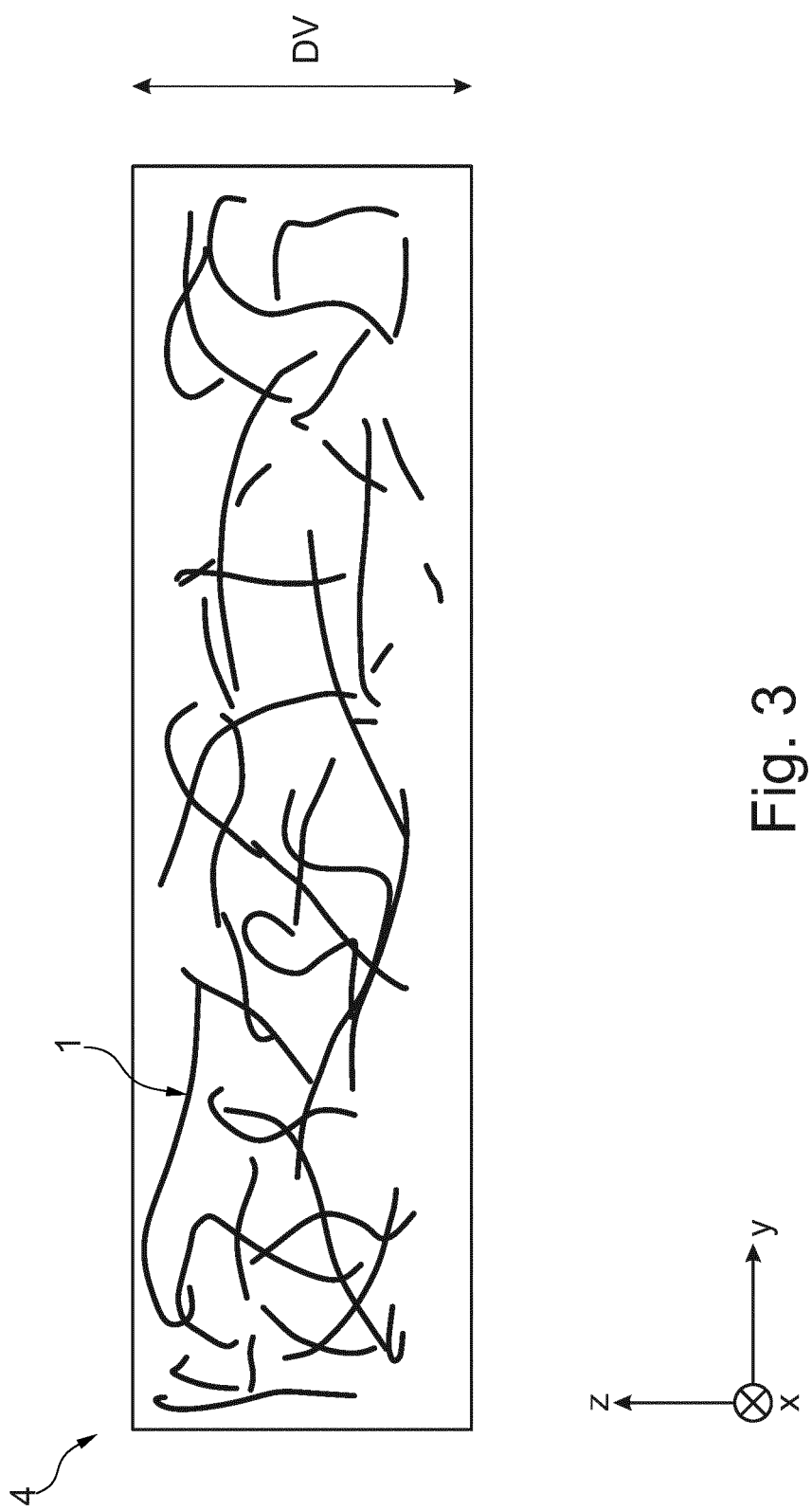
FIG. 3: shows a cross-sectional side view of a nonwoven according to an embodiment example.

FIG. 3 is a cross-sectional side view of a nonwoven 4 according to an embodiment example of the disclosure. This may be the nonwoven 4 according to the disclosure of FIG. 2. Again, it can be seen that the fibers 1 extend irregularly in all three spatial directions X, Y, and Z. The length L of the fibers 1 according to the disclosure may be essentially the same or different. In this illustration, only the thickness DV can be seen.

Figure 4:
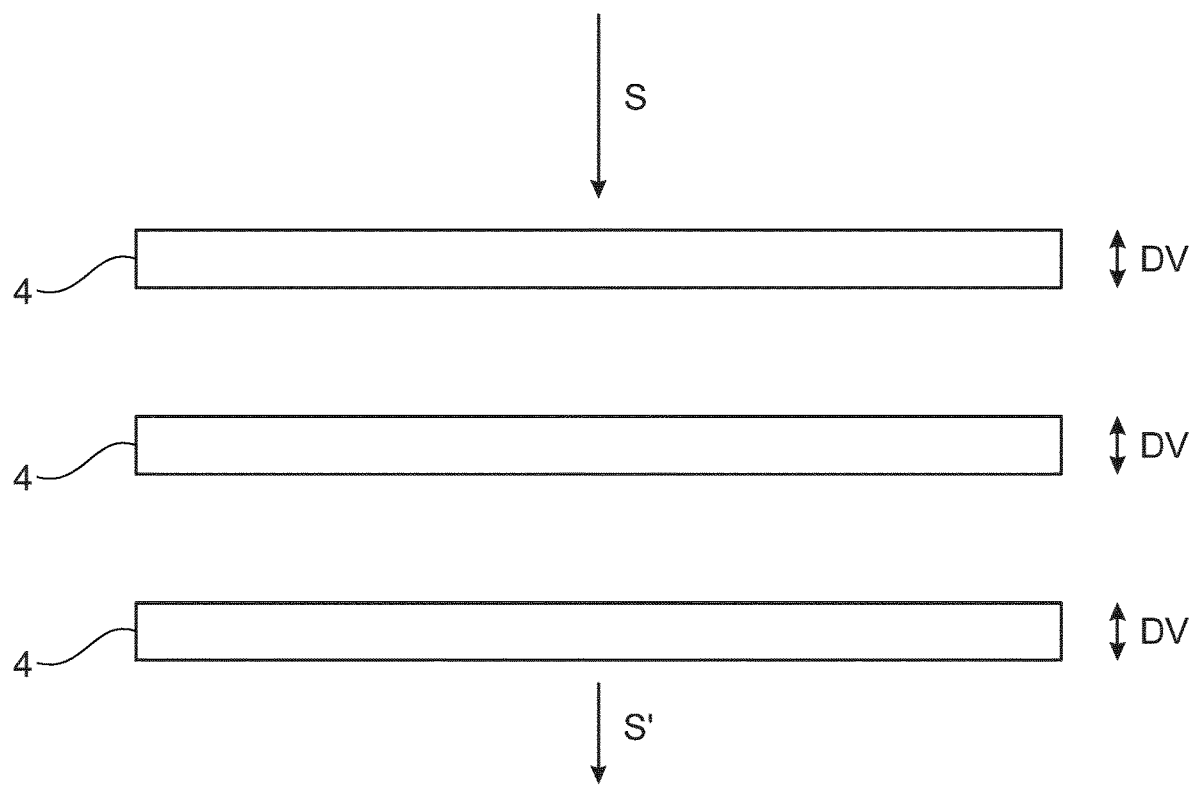
FIG. 4: shows an embodiment example with multiple layers of a nonwoven according an embodiment example.

FIG. 4 is an embodiment example with multiple layers (sandwich structure) of a nonwoven 4 according to an embodiment of the disclosure. If the nonwoven 4 according to the disclosure is stacked in multiple layers (in this case, for example, 3 layers with 2, 4, 5, 6, 7, 8, 9, 10 or more layers being alternatively possible), which may be arranged spaced from one another where appropriate, the attenuation effect may be increased further. The incident electromagnetic radiation S is then attenuated by a factor and reaches the opposite side of the nonwoven 4 according to the disclosure comprising the sandwich arrangement of multiple nonwoven layers only as electromagnetic radiation S'.

The present disclosure is inter alia based on the surprising finding that the nonwoven material 4 according to the disclosure exhibits a shielding effectiveness of ≥10% for electromagnetic radiation, in particular terahertz radiation in the range from 5 THz to 300 THz. At 30 THz, the shielding effectiveness is preferably ≥70%, more preferably ≥80%, and even more preferably ≥90%, while the shielding effectiveness at 300 THz is ≥15%, preferably ≥20%. For terahertz radiation in the range from 5 THz to 300 THz, the nonwoven 4 according to the disclosure exhibits a shielding effectiveness of ≥100 decibels (dB), preferably 120 decibels (dB).

Moreover, electromagnetic radiation in considerably lower or higher frequency ranges may also be absorbed and thus shielded. In general, the following relationship applies: the thinner the polymer fibers 1 the smaller the openings between the polymer fibers 1, and the stronger the shielding effect also for higher-frequency radiation.

At the same time, the nonwoven material 4 according to the disclosure is advantageous in that it has a low material weight compared to conventional lead materials used for shielding but is still pressure- and tension-resistant.

Moreover, due to the nonwoven structure, the nonwoven material 4 according to the disclosure is flexible and at the same time breathable.

According to current knowledge, it is assumed that the electromagnetic radiation incident on the plane of the surface of the non-woven 4 according to the disclosure, in particular terahertz radiation, is absorbed by the second metal alloy molecules 2, which form a lattice on the surface of the polymer fibers 1. During the absorption of the electromagnetic radiation by the second metal alloy molecules 2 in the surface lattice, static charge is created due to convection. Said charge is drawn into the depth (Z axis) of the nonwoven 4 due to the charge potential difference between the second 2 and the first metal alloy 3. The first metal alloy molecules 3 in the lattice of the fiber core K process the created charge faster than the second metal alloy molecules 2 on the surface and forward the charges created by the electromagnetic waves as a convective current inside the core K. This generally creates opposite charges or potentials on a micrometer scale. Due to the random and irregular arrangement of the polymer fibers 1 with filled fiber cores in the nonwoven 4 according to the disclosure on a micrometer scale, the opposite charges, or the associated local potentials, attenuate each other almost completely on a decimeter scale. In the nonwoven according to the disclosure, a corresponding attenuation of the charges/potentials (potential cancelation) of >98%, more particularly >99%, could be measured. No voltage is thus created on the surface, and a reflection of electromagnetic radiation/frequency can be avoided according to the disclosure.

According to the first subject matter of the disclosure, first metal alloys 3 and second metal alloys 2 are provided. These are preferably provided in powder form. The particles of the powder have a mean particle diameter in the µm range, more preferably a mean particle diameter in the range of ≤100 µm, more preferably ≤50 µm, and even more preferably ≤20 µm.

According to all subject matters of the present disclosure, the first metal alloy 3 of step a) and/or the second metal alloy 2 of step c) preferably comprises one, two, three or more different metal alloys.

According to the disclosure, a first metal alloy 3 is preferred, wherein the metals of the first metal alloy(s) 3 of step a) of the first subject matter are selected from two, three, four or more metals from the group consisting of lead (Pb), titanium (Ti), palladium (Pd), praseodymium (Pr), lanthanum (La), indium (In), cobalt (Co), aluminum (Al), chromium (Cr), nickel (Ni), molybdenum (Mo), barium (B a), yttrium (Y), samarium (Sm), silicon (Si), germanium (Ge) and iron (Fe).

For example, the first metal alloy 3 of step a) may be selected from the group consisting of cobalt alloys, for example $Co_{68.7}Fe_4Ni_1B_{13}Si_{11}Mo_{2.3}$, $Nd_3Fe_{68-x}Mn_xCo_{18}B_{11}$ (x=0, 1, 2) or $CoFe_2$; palladium alloys, preferably paladium-indium-iron alloys, for example $Pd_{57}In_{25}Fe_{18}$, and $Pd_{56.2}In_{26.3}Fe_{17.5}$; preferably titanium-palladium-iron alloys, for example $Ti_{50}Pd_{40}Fe_{10}$, and $Ti_{50}Pd_{35}Fe_{15}$; preferably palladium-manganese-indium alloys, for example $Pd_2MnIn$; manganate alloys, for example praseodymium-lanthanum-calcium-manganate alloys such as praseodymium-calcium-manganate alloys or lanthanum-calcium-manganate alloys, for example $Pr_{0.7}Ca_{0.3}MnO_3$ or $La_{0.7}Ca_{0.3}MnO_3$; neodymium-lead-manganate alloys such as $Nd_{0.5}Pb_{0.5}MnO_3$, lanthanum-barium-manganate alloys such as $La_{2/3}Ba_{1/3}MnO_3$; boron-copper alloys such as $B_2CuO_2$; alloys with a high tungsten content such as barium-yttrium-copper-tungsten alloys and copper-samarium-tungsten alloys and iron alloys such as FeNiMo, $Fe_{85}Si_{3.5}Al_{5.5}Cr_6$ and FeMnW—($P_{0.5}$ $Geo_{0.1}Pb_{0.4}W_{0.2}$).

According to the disclosure, the second metal alloy 2 is preferred when the metals of the second metal alloy(s) 2 of step c) are selected from two, three, four or more metals from the group consisting of iron (Fe), manganese (Mn), copper (Cu), zinc (Zn), tungsten (W), silicon (Si), silver (Ag) and tin (Sn).

For example, the second metal alloy 2 of step c) may be selected from the group consisting of manganese alloys, preferably nickel-manganese-tin alloys, for example $Ni_2Mn_{1.44}Sn_{0.56}$, and $Ni_2Mn_{1.42}Sn_{0.58}$; preferably nickel-manganese-gallium alloys, for example $Ni_2MnGa$; preferably iron-manganese-silicon alloys, for example FeMnSi, $Fe_{57.4}Mn_{35}Si_{7.6}$, $Fe_{66.7}Mn_{28.8}Si_{6.5}$ and FeMnW—($P_{0.5}Ge_{0.1}Pb_{0.4}W_{0.2}$), as well as silver-magnesium alloys, for example Ag—$MgF_2$—Ag.

According to a cumulatively or alternatively preferred configuration of the present disclosure, the first metal alloy(s) 3 of step a) and, where appropriate, the second metal alloy(s) 2 of step c) are preferably selected such that they are oxygen-free. For this configuration, phosphorus (P) may, for example, be used to provide an oxygen-free metal alloy.

In connection with the present disclosure, the polymer material, for example for the fibers 1 or also pellets or other configurations of step b) of the first subject matter, may be selected from conventional polymer materials. Polymer materials that are temperature-stable up to 95° C. are particularly suitable for this. Depending on the application, the polymer materials may be selected from the list consisting of the group of polyesters, for example polyethylene terephthalate (PET), and the group of polyamides, for example poly(p-phenylene therephthalamide) (PPTA) and poly(m-phenylene isophthalamide) (PMPI). Polyesters such as PET are preferably used when softer materials are intended, while polyamides are chosen to achieve harder nonwoven material properties. To facilitate mixing of the polymer material with the first metal alloy molecules 3, suitable viscosity reducing agents are added to the polymer material. The suitable viscosity depends on the mixing technique. For example, alcohols, and preferably highly cyclic alcohols such as C5 to C9 alcohols, are conventionally used for polyesters. The more highly cyclic the alcohol the more viscous the composition. According to the disclosure, a C6 or C7 alcohol may preferably be used, more preferably a C6 alcohol. In the case of polyamides, suitable acids, preferably formic acid, are conventionally used as the viscosity reducing agent.

According to an embodiment of the present disclosure, conventional physical vapor deposition processes may be used for the production of the first metal alloy molecules 3 in step d) and/or the second metal alloy molecules 2 in step e), preferably (i) using evaporation, for example thermal evaporation, electron beam evaporation, laser beam evaporation, arc evaporation or molecular beam epitaxy, or (ii) using sputtering, for example ion beam deposition, or (iii) using ion plating, or (iv) using ionized cluster beam deposition (ICBD). According to the disclosure, it is also possible to combine several physical vapor deposition processes, for example electron beam evaporation and arc evaporation. Such a combination is preferred when a corresponding evaporation of the first metal alloy 3 is to be achieved in a small space.

In the case of the thermal evaporation processes, depending on the type of alloy, the first and/or second metal alloys are heated up to 6,000° C. in suitable apparatuses and are evaporated so as to form first and/or second metal alloy molecules 3, 2. The first and/or second metal alloy molecules 3, 2 are preferably cooled with suitable methods, preferably by feeding a suitable gas, more preferably a noble gas or alternatively fluorine, before they are brought into contact with the polymer material in step d), the surface of the polymer fibers 1 with filled fiber cores in step e), or the surface of the nonwoven in step f). Oxygenous gases such as $CO_2$ may additionally be used in the evaporation of the second metal alloys into metal alloy molecules 2 since the second metal alloy molecules come into contact with air oxygen due to their arrangement on the surface of the polymer fiber 1. For the evaporation of the first metal alloys into first metal alloy molecules 3, on the other hand, an oxygen-free atmosphere is preferred to avoid oxidation of the metal alloy molecules 3.

The evaporation of the first metal alloy especially creates first metal alloy molecules 3 having a trigonal structure. During the mixing of the first metal alloy molecules 3 with the polymer material provided in step b) and arrangement of the metalized polymer material in fiber form, the first metal alloy molecules 3 having a trigonal structure are essentially arranged inside the core K of the polymer fiber and form a lattice in which the individual first metal alloy molecules 3 are each isolated by the polymer but overlie the electron clouds of the adjacent first metal alloy molecules 3.

The proportion of first metal alloy molecules 3 having a trigonal structure is preferably 80 wt % based on the total weight of the first metal alloy in the polymer material. The evaporation also creates a smaller proportion (up to about 20 wt % based on the total weight of the first metal alloy) of first metal alloy molecules 3 having a hexagonal or octagonal structure. However, the latter position themselves at the surface of the polymer fiber 1 due to their higher weight. In connection with the present disclosure, it has been found that first metal alloy molecules 3 having a hexagonal or octagonal structure which are arranged on the surface of the polymer fiber 1 are removed due to friction between the polymer fibers 1, so that the polymer fiber 1 essentially comprises first metal alloy molecule 3 having a trigonal structure, i.e. 80 wt % or more, which are essentially arranged inside the core K, i.e. in the interior of the polymer fiber 1.

A possible implementation for producing corresponding polymer fibers 1 is described in more detail in the implementation example.

In this case, the polymer material in drop form is initially mixed with the first metal alloy molecule 3 before being arranged to form the polymer fiber 1 with filled fiber core using conventional processes, preferably e-spinning.

g. Prior to the e-spinning process, it may be necessary to reduce the viscosity of the metalized polymer mixture prior to enable e-spinning.

Any conventionally suitable device may be used to provide the polymer material in drop form. If an ink-jet printer is used, preferably one that is controlled piezoelectrically, the drop size can be controlled selectively, so that reproducible results can be obtained. The drop may be mixed with the first metal alloy molecules using conventional processes. According to a preferred implementation of the disclosure, the first metal alloy is fed from a storage container via a feedline system and evaporated, preferably at the printhead, into metal alloy molecules 3 which are injected into the polymer drop, for example, using a printhead injector. The amount of the first metal alloy depends on the required frequency range that is to be shielded. A higher degree of molecular fiber core filling with the first metal alloy molecules 3 enables shielding in a higher frequency range. At the same time, however, a higher fiber core filling results in reduced flexibility of the nonwoven 4 according to the disclosure.

An amount of 10 wt % or more of first metal alloy molecules 3 is usually mixed based on the volume of the polymer material. In the context of the present disclosure, the volume of the polymer material means the volume of the polymer material including possible viscosity reducing agents.

An amount of 50 wt % or more of first metal alloy molecules 3 will not result in a further improvement of the shielding effect, so that, according to the disclosure, a range between 10 and 50 wt % of first metal alloy molecules 3 is used based on the volume of the polymer material. According to the disclosure, the preferred range is between 15 and 35 wt %, more preferably 20 to 30 wt %, of first metal alloy molecules based on the volume of the polymer material.

The mean particle diameter (as measured, for example, using laser Doppler microflow or white light spectroscopy) of the first metal alloy molecules 3, in particular for more than 80% of the particles of the first metal alloy molecules 3 in the polymer fiber with filled fiber core, is usually 2 to 4 nm, with the atom lattice structure of the alloy changing into a predominantly trigonal lattice structure. One explanation for this may be that oxide bridges at the alpha flank of the metal alloy molecules are cut off causing the trigonal linking arms to expand to some extent.

The polymer fibers 1 with filled fiber cores according to the disclosure preferably have a mean fiber diameter DF of ≤500 µm, more preferably ≤100 µm, even more preferably 50 µm, and even more preferably ≤1 µm. In an e-spinning process, the mean fiber diameter DF is usually controlled via the distance of the magnet.

According to the disclosure, the polymer fibers 1 with filled fiber cores can be coated prior to or after the production of the nonwoven 4 according to the disclosure.

If the polymer fibers 1 are coated with the second metal alloy prior to the production of the nonwoven 4 according to the disclosure, the polymer fibers 1 are preferably dried first and then the metal alloy of step c) is fed from the storage container via a suitable feedline and evaporated using conventional processes as described above and arranged on the surface H of the polymer fibers 1. However, such a method involves the risk that the second metal alloy molecules form clusters on the surface of the polymer fiber 1 weakening the shielding effect.

Therefore, the alternative method is preferred according to which a nonwoven 4 according to the disclosure is first produced by randomly and irregularly arranging the polymer fibers 1 with filled fiber cores in the three spatial dimensional directions (X, Y, and Z) using conventional processes, which nonwoven is then preferably consolidated and/or dried before the surface of the nonwoven 4 (i.e. the surface of the fibers 1 already bonded into a nonwoven 4) is coated with the evaporated second metal alloy. In this process, an amount of preferably 10 to 20 wt % of first metal alloy molecules 2 is conventionally used based on the volume of the polymer material, including possible viscosity reducing agents.

The second metal alloy molecules 2 in the surface lattice have a mean particle diameter (as measured, for example, using laser Doppler microflow or white light spectroscopy) of 5 to 7 nm. According to the disclosure, the surface lattice is characterized in that the second metal alloy molecules 2 are arranged on the surface H of the nonwoven isolated from one another and form a lattice in which the electron clouds of the individual second metal alloy molecules 2 overlie one another.

In the non-consolidated state, the nonwoven 4 according to the disclosure normally has a layer thickness DV in the centimeter range, in particular 4 to 8 cm. In the consolidated state, the nonwoven 4 according to the disclosure normally has a layer thickness DV of 1 mm, preferably 500 µm, and more preferably 200 µm. The weight of the nonwoven 4 according to the disclosure is preferably 500 g/m$^2$, more preferably 250 g/m$^2$, and even more preferably 100 g/m$^2$. According to an exemplary configuration, a nonwoven according to the disclosure may have a weight of 48 g/m$^2$ at a layer thickness of about 70 µm, or a weight of 84 g/m$^2$ at 200 µm.

According to a cumulatively or alternatively preferred configuration, one or more additional materials are provided which improve the temperature stability of the nonwoven 4 according to the disclosure since the absorption of electromagnetic radiation by the surface lattice of the second metal alloy also creates heat due to convection. According to this preferred configuration, the material which improves the temperature stability of the polymer material may be selected from glass-like materials, in particular glass, ceramics and porcelain, and/or carbonaceous materials such as graphene. Due to its lubricating effect, graphene is suitable especially in cases where the nonwoven material according to the disclosure is to be used to shield hinges, openings and doors.

The materials which improve the temperature stability of the nonwoven 4 according to the disclosure may be mixed with the polymer material and the first metal alloy using conventional processes. For example, the material which improves the temperature stability of the polymer material may be added in powder form and mixed with the metal alloy molecule-polymer mixture in step d) before the polymer fiber 1 is produced. The materials which improve the temperature stability of the nonwoven 4 according to the disclosure preferably have a suitable mean particle diameter, preferably 100 µm, 50 µm, 20 µm, 10 µm or 1 µm. According to an embodiment of the disclosure, the material which improves the temperature stability of the nonwoven 4 according to the disclosure is ground, preferably to nanocrystals, and exhibits a mean particle diameter (as measured, for example, using laser Doppler microflow or white light spectroscopy) of 500 nm, more preferably 250 nm, and in particular a mean particle diameter in the range from 10 nm to 50 nm.

The temperature stability of the nonwoven 4 according to the disclosure normally increases with increasing weight proportion of the material which improves the temperature stability of the fibers 1 or the nonwoven 4. However, the tensile elasticity of the nonwoven material 4 according to the disclosure decreases with increasing weight proportion. Therefore, according to the disclosure, the weight proportion of the material which improves the temperature stability, preferably glass, ceramics and porcelain and/or carbonaceous materials such as graphene, is in the range of up to 25 wt %, preferably 10 to 20 wt %, and more preferably 15 wt %, based on the volume of the polymer material, including possible viscosity reducing agents.

The nonwoven 4 according to the disclosure, which can be produced using one of the production methods according to the disclosure, is further characterized in that if the polymer material was evaporated due to exposure to intense heat, the two metal lattices, i.e. the inner fiber core lattice or fiber core/temperature increasing material lattice on the one hand and the outer surface polymer fiber lattice on the other hand, would still remain intact. In other words: The functions of the two lattices, i.e. the absorption of the electromagnetic waves by the outer lattice and the processing of the static charge created through convection by the inner fiber core lattice or fiber core/temperature increasing material lattice, are maintained and the shielding effect remains intact. Due to the missing polymer, the material will have less tensile strength. It is therefore conceivable that stabilizing measures are taken to achieve better resistance against the influence of heat. The nonwoven 4 according to the disclosure may, for example, be arranged in a stabilizing apparatus made, for example, of materials such as concrete.

The nonwoven 4 according to the second subject matter is preferably characterized in that the nonwoven includes 50 to 60 wt % of polymer material, up to 50 wt %, preferably 10 to 40 wt %, and more preferably 15 to 35 wt % of first and second metal alloys—preferably 10 to 15 wt % of each of the first and second metal alloys—and, where appropriate, up to 25 wt %, preferably 10 to 20 wt %, of material for improving the temperature stability, respectively based on the total weight of the nonwoven 4 according to the disclosure.

The nonwoven 4 according to the disclosure, which is suitable especially for shielding terahertz radiation in the range from 5 THz to 300 THz, preferably has
- a shrinkage value of up to 5% according to DIN 7715, part 3, class E3, and/or
- a surface resistance of 4 to 7 ohms/inch, preferably 5.5 ohms/inch, at a 20 mA test current in the X-Y-Z axis of the nonwoven 4, and/or
- temperature stability in the range from −40° C. to +120° C., and/or
- ozone resistance, and/or
- a water absorption capacity of 4%; and/or
- a weight of 250 g/m², preferably 100 g/m².

According to the disclosure, the nonwoven 4 according to the disclosure is used for shielding electromagnetic radiation, in particular terahertz radiation, more preferably terahertz radiation in the range from 5 THz to 300 THz.

The nonwoven 4 according to the disclosure is used in particular for producing protective suits for humans or animals which are to be used for shielding electromagnetic radiation, in particular terahertz radiation, more preferably terahertz radiation in the range from 5 THz to 300 THz.

Alternatively or cumulatively, the nonwoven 4 according to the disclosure is used for shielding buildings, (land, waterborne and/or airborne) vehicles, objects and/or pathways from electromagnetic radiation in the range from 5 THz to 300 THz.

Alternatively or cumulatively, the nonwoven 4 according to the disclosure is used for producing polymer insulations of openings in buildings or (land, waterborne, and/or airborne) vehicles or pathways. Nonwoven materials that include a proportion of carbonaceous materials such as graphene as a temperature stability increasing material are particularly suitable and preferred for such applications. The graphene increases the lubricating effect, so that improved sealing is obtained.

IMPLEMENTATION EXAMPLES

Example 1 Production of a Nonwoven According to the Disclosure a) Providing a First Metal Alloy 5 grams of FeMnW—($P_{(0.5)}Ge_{(0.1)}Pb_{(0.4)})W_{(0.2)}$) are provided, wherein the alloy contains the following weight constituents by weight:
- 1.23 grams of iron (Fe). Alternatively, CuAl may be used instead of Fe.
- 0.6 grams of manganese (Mn).
- 0.7 grams of tungsten (W).
- 0.53 grams of phosphorus (P). Phosphorus is used to obtain an oxygen-free alloy.
- 1.25 grams of Germanium (Ge).
- 0.7 grams of lead (Pb).

The first metal alloy is prepared by heating the construct FeMnW to about 1,100° C. and thereby evaporating the same. Further, the construct PGePbW is heated to 2,000° C.

The heating and evaporating may be performed using conventional processes such as physical vapor deposition, preferably (i) using evaporation, for example thermal evaporation, electron beam evaporation, laser beam evaporation, arc evaporation or molecular beam epitaxy, or (ii) using sputtering, for example ion beam deposition, or (iii) using ion plating, or (iv) using ionized cluster beam deposition (ICBD). In the present case, a physical vapor deposition process using thermal evaporation was used. According to the disclosure, a combination of electron beam evaporation and arc evaporation is used to enable continuous evaporation of the first metal alloy in a small space.

Both evaporated constructs are mixed and cooled (tempered) to 650° C., preferably by feeding oxygen-free gases such as noble gases or other non-oxygenous gases such as fluorine, so as to create the first metal alloy. In the present example, argon was used. The inventor found that residues may remain in the first metal alloys if fluoric gases are used, so that fluoric gases are preferably not used for the production method according to the disclosure.

b) Providing a Polymer Material

According to the present implementation example, the nonwoven material is to become relatively solid, so that the polymer is selected from the group of polyamides, for example poly(p-phenylene terephthalamide) (PPTA) and poly(m-phenylene isophthalamide) (PMPI). Formic acid is selected as the viscosity reducing agent.

If a softer nonwoven material is to be created, use is made, for example, of polyethylene terephthalate (PET), which is preferably mixed with highly cyclic alcohols (C5 to C9), preferably C6 alcohols until a suitable viscosity is obtained.

The suitable viscosity depends on the process used for mixing the first metal alloy molecules with the polymer material.

c) Providing a Second Metal Alloy 5 grams of $FeMnP_{(0.5)}$—$(CuSi_{(0.4)})$ are provided, wherein the alloy contains the following weight constituents by weight:

1.9 grams of iron (Fe).
1.9 grams of manganese (Mn).
0.5 grams of phosphorus (P). Phosphorus is used to preferably obtain an oxygen-free metal alloy.
0.3 grams of copper (Cu).
0.4 grams of silicon (Si).

The second metal alloy is prepared by heating the construct FeMnP to 1,050° C. and heating the construct CuSi to 1,800° C. Both evaporated constructs are mixed and—as described under a)—cooled (tempered) to 650° C. so as to create the second metal alloy.

d) Producing Polymer Fibers with Filled Fiber Cores from the First Metal Alloy and the Polymer Material.

In the present case, the polymer material provided in step b) is provided in drop form, for example using piezo-controlled ink-jet technology, and, based on the volume of the polymer drop, up to a maximum of 20 wt/vol %, preferably 10 to 15 wt/vol %, of the first metal alloy molecules are injected using a printhead injector. In other words: 100 ml of metalized polymer material include a proportion of up to 5 grams, preferably 2.5 grams to 3.75 grams, of first metal alloy molecules.

If necessary, the viscosity of the polymer material is adjusted such that the polymer material can be provided in drop form and the first metal alloy molecules can be injected into the drop.

The metal vapor of the first metal alloy is in the present case created through laser evaporation at the printhead. Alternatively, other techniques may be used, for example electrode evaporation.

Using suitable techniques, in the present case a combination of e-spinning and feeding relatively cold oxygen-free gases such as in the present case argon, the metalized polymer drop is then drawn so as to form a polymer fiber with filled fiber cores and cooled. In this process, the distance of the electromagnetic field governs the thickness of the polymer fiber with filled fiber cores. The larger the distance from the magnet, the thicker the diameter of the polymer fiber 1 with filled fiber cores.

The mean particle diameter of the first metal alloy molecules in the polymer fiber 1 with filled fiber cores is normally 2 to 4 nm (preferably >80% of the particles), with the atom lattice structure of the alloy changing into a predominantly trigonal lattice structure. One explanation for this may be that oxide bridges at the alpha flank of the metal alloy molecules are cut off causing the trigonal linking arms to expand to some extent.

The polymer fibers with filled fiber cores according to the disclosure preferably have a mean diameter of ≤500 μm, more preferably ≤100 μm, even more preferably ≤50 μm, and even more preferably ≤1 μm.

After electrospinning and feeding cold gas, a nonwoven is formed through random and irregular deposition and arrangement of the polymer fibers with filled fiber cores, which nonwoven has a thickness in the centimeter range, approximately in the range from 4 to 8 cm. The nonwoven thus obtained has a moisture content of about 40% based on the weight of the nonwoven.

In the present case, the nonwoven is preferably consolidated and dried before the second metal alloy is applied to at least a part of the surface of the nonwoven using physical vapor deposition using plasma evaporation. The layer thickness of the nonwoven consolidated in this manner is 200 μm with a weight of 84 g/m² and may also be about 70 μm with a weight of 48 g/m².

The second metal alloy molecules in the surface lattice have a mean particle diameter of 5 to 7 nm. The surface lattice is characterized in that the second metal alloy molecules are arranged on the surface of the nonwoven isolated from one another and form a lattice in which the electron clouds of the individual second metal alloy molecules overlie one another.

100 ml of polymer material, including possible viscosity reducing agents, and up to 5 grams of first metal alloy, may yield an area of 10 dm² of nonwoven according to the disclosure (accordingly, up to 50 grams of first metal alloy are required for 1 m² of nonwoven according to the disclosure).

The nonwoven 4 produced according to the disclosure enables shielding of electromagnetic radiation, in particular terahertz radiation in the range from 5 THz to 300 THz, but also radiation at higher and lower frequencies, wherein the charges are drawn into the depth of the nonwoven 4 due to second metal alloy lattices present on the surface of the polymer fiber 1 since the charge of the first metal alloy molecules 3 inside the core differs from that at the surface. Also, the first metal alloy molecules 3 inside the core K are faster in current conduction or charge compensation than the second metal alloy molecules 2 of the surface lattice. This creates a local "undercharge" on the micrometer scale. Due to the random and irregular arrangement of the polymer fibers with filled fiber cores in the nonwoven according to the disclosure, the charges or potential differences cancel each other out almost completely across the overall nonwoven according to the disclosure.

Example 2 Physical Characteristics of the Nonwoven According to the Disclosure as Described in Example 1

The nonwoven according to the disclosure shows the following shielding effectiveness values:
At 30 THz: 80 to 90%
At 300 THz: 15 to 20%

The nonwoven according to the disclosure shows the following resistance in X-Y-Z axis of the nonwoven according to the disclosure:
5.5 ohms/inch at a 20 mA test current The nonwoven according to the disclosure shows the following resistances:

| | |
|---|---|
| Weather | very good |
| Oil and gasoline | good |
| Ageing | very durable |
| Solvents | medium |
| Lye | good |
| Ozone | good |

The nonwoven according to the disclosure shows the following flammabilites according to DIN 4102 B 1:
Flammable after 25 minutes at 270° C. and after 40 Minutes at 240° C.
Fire-resistant according to UL 94-HB and UL 94-VO.

The nonwoven according to the disclosure shows a high permeability and accordingly is breathable.

The nonwoven according to the disclosure shows a shrinkage and tolerances of up to 5%, measured, for example, according to DIN 7715, part 3, class E3.

The nonwoven according to the disclosure is temperature stable in the range from −40° C. to +120° C.

The nonwoven according to the disclosure is ozone resistant and does not exhibit any cracks. The nonwoven shows a water absorption of <4% based on the weight of the nonwoven.

Although exemplary embodiments have been disclosed, a worker of ordinary skill in this art would recognize that certain modifications would come within the scope of this disclosure. For that reason, the following claims should be studied to determine the true scope and content of this disclosure.

The invention claimed is:

1. A method for producing a nonwoven for shielding electromagnetic radiation in the terahertz (THz) range of 5 THz to 300 THz, comprising a network of coated polymer fibers with filled fiber cores that is arranged randomly and irregularly in three spatial dimensional directions (X, Y, and Z) of said nonwoven, wherein the method comprises the following steps:
 a. providing a first metal alloy adapted to shield electromagnetic radiation in the terahertz (THz) range of 5 THz to 300 THz,
 b. providing a polymer material,
 c. providing a second metal alloy which differs from the first metal alloy of step a) in that a charge potential difference can be effected between the first and second metal alloys,
 d. producing polymer fibers with filled fiber cores by evaporating the first metal alloy of step a) into first metal alloy molecules having a trigonal structure and mixing the first metal alloy molecules with the polymer material provided in step b) as well as arranging the metalized polymer material in fiber form, wherein the first metal alloy molecules having a trigonal structure are essentially arranged inside a core of the polymer fiber and form a lattice in which individual first metal alloy molecules are each isolated by the polymer but overlie electron clouds of adjacent first metal alloy molecules, and
 e. coating at least a part of a surface of the polymer fibers with filled fiber cores of step d) with the second metal alloy of step c), wherein the second metal alloy is evaporated into individual second metal alloy molecules having a hexagonal or octagonal structure which are arranged on a polymer fiber surface isolated from one another and form a surface lattice in which the electron clouds of individual second metal alloy molecules overlie one another, and producing the nonwoven by randomly and irregularly arranging the coated polymer fibers with filled fiber cores in said three spatial dimensional directions (X, Y, and Z), or
 f. producing the nonwoven by randomly and irregularly arranging the polymer fibers with filled fiber cores of step d) in the three spatial dimensional directions (X, Y, and Z) and coating at least a part of a surface of the nonwoven with the second metal alloy of step c), wherein the second metal alloy is evaporated into individual second metal alloy molecules having a hexagonal or octagonal structure which are arranged on a polymer fiber surface isolated from one another and form a surface lattice in which the electron clouds of the individual second metal alloy molecules overlie one another.

2. The method for producing the nonwoven according to claim 1, wherein conventional physical vapor deposition processes may be used for production of the first metal alloy molecules in step d) and/or the second metal alloy molecules in step e).

3. The method for producing said nonwoven according to claim 1, wherein the first metal alloy molecules in step a) and/or the second metal alloy molecules in step c) are cooled by feeding a noble gas or fluorine, before they are brought into contact with the polymer material in step d), the surface of the polymer fibers with filled fiber cores in step e), or the surface of the nonwoven in step f).

4. The method for producing said nonwoven according claim 1, wherein the first and second metal alloys in step a) and step c) are provided in powder form having a mean particle diameter in the range of ≤100 µm.

5. The method for producing said nonwoven according to claim 1, wherein in step b) the polymer material is provided in an apparatus that is controlled piezoelectrically and which in step d) provides the polymer material in drop form for injection of the first metal alloy molecules into the polymer material.

6. The method for producing said nonwoven according to claim 1, wherein in step d) the polymer fibers with filled fiber cores are produced using electrospinning, wherein the polymer fibers with filled fiber cores having a mean particle diameter of ≤500 µm.

7. The method for producing said nonwoven according to claim 1, wherein the first metal alloy of step a) and/or the second metal alloy of step c) comprises one, two, three or more different metal alloys.

8. The method for producing said nonwoven according to claim 1, wherein the metals of the first metal alloy(s) of step a) are selected from two, three, four or more metals from the group consisting of lead (Pb), titanium (Ti), palladium (Pd), praseodymium (Pr), lanthanum (La), indium (In), cobalt (Co), aluminum (Al), chromium (Cr), nickel (Ni), molybdenum (Mo), barium (B a), yttrium (Y), samarium (Sm), silicon (Si), germanium (Ge) and iron (Fe).

9. The method for producing said nonwoven according to claim 1, wherein the metals of the second metal alloy(s) of step c) are selected from two, three, four or more metals from the group consisting of iron (Fe), manganese (Mn), copper (Cu), zinc (Zn), tungsten (W), silicon (Si), silver (Ag) and tin (Sn).

10. The method for producing said nonwoven according to claim 1, wherein the first metal alloys(s) of step a) are selected from at least one of the group consisting of
 cobalt alloys;
 palladium alloys;
 indium-phosphate alloys;
 manganate alloys;
 neodymium-lead-manganate alloys;
 boron-copper alloys;
 alloys with a high tungsten content and iron alloys.

11. The method for producing said nonwoven according to claim 1, wherein the second metal alloy(s) of step c) are selected from the group consisting of manganese alloys; and
 silver-magnesium alloys.

12. The method for producing said nonwoven according to claim 1, wherein the first and/or second metal alloys of step a) and step c) are oxygen-free.

13. The method for producing said nonwoven according to claim 1, wherein one or more materials which improve a temperature stability of the nonwoven are additionally provided and are incorporated in the metal alloy molecule-polymer mixture in step d).

14. The method for producing said nonwoven according to claim 13, wherein the material which improves the temperature stability of the polymer material is selected from at least one of glass-like materials, and carbonaceous materials.

15. The method for producing said nonwoven according to claim 13, wherein the material which improves the temperature stability of the polymer material is added to the metal alloy molecule-polymer mixture as a powder in step d).

16. The method for producing said nonwoven according to claim 1, wherein the polymer material of step b) is selected from at least one of the list consisting of the group of polyesters, and the group of polyamides.

17. The method for producing said nonwoven according to claim 1, wherein the produced nonwoven has a layer thickness of ≤1 mm.

18. A nonwoven for shielding electromagnetic radiation in the range of 5 THz to 300 THz, which is produced according to claim 1.

19. The nonwoven according to claim 18, wherein, for terahertz radiation in the range from 5 THz to 300 THz, the nonwoven has a shielding effectiveness of ≥10% at 30 THz, and/or has a shielding effectiveness of ≥15 at 300 THz.

20. The nonwoven according to claim 18, wherein the nonwoven has an attenuation value of ≥100 decibels (dB) for terahertz radiation in the range from 5 THz to 300 THz.

21. The nonwoven according to claim 18, wherein the nonwoven includes 50 to 60 wt % of polymer material, up to 50 wt % of first and second metal alloys and, up to 25 wt % of material for improving a temperature stability, respectively based on the total weight of the nonwoven.

22. The nonwoven according to claim 18, wherein the nonwoven has a shrinkage value of up to 5% according to DIN 7715, part 3, class E3, and/or has a surface resistance of 4 to 7 ohms/inch at a 20 mA test current in the X-Y-Z axis of the nonwoven, and/or is temperature stable in a range from −40° C. to +120° C., and/or is ozone-resistant, and/or has a water absorption capacity of 4%; and/or has a weight of 200 g/m$^2$.

23. Using said nonwoven made according to the method of claim 1 to shield terahertz radiation in the range from 5 THz to 300 THz.

24. Using said nonwoven made according to the method of claim 1 to produce protective suits for humans or animals.

25. Using said nonwoven made according to the method of claim 1 to shield buildings; land, waterborne and/or airborne vehicles; objects; and/or pathways.

26. Using the nonwoven made according to the method of claim 1 to produce polymer insulations of openings in buildings or land, waterborne, and/or airborne vehicles or objects or pathways.

27. The method for producing the nonwoven according to claim 4, wherein the mean particle diameter is in the range of ≤50 μm.

28. The method for producing the nonwoven according to claim 6, wherein the mean particle diameter is ≤100 μm.

29. The method for producing said nonwoven according to claim 17, wherein the layer thickness is ≤500 μm.

30. The nonwoven according to claim 19, wherein the shielding effectiveness is ≥70% at 30 THz; and/or wherein the shielding effectiveness is ≥20%, at 300 THz.

31. The nonwoven according to claim 21, wherein the nonwoven includes up to 10 to 40 wt % of the first and second metal alloys; and/or wherein the nonwoven includes 10 to 20 wt % of the material for improving the temperature stability, respectively based on the total weight of the nonwoven.

32. The nonwoven according to claim 22, wherein the surface resistance is 5.5 ohms/inch at a 20 mA test current in the X-Y-Z axis of the nonwoven; and/or wherein the weight of the nonwoven is 100 g/m$^2$.

33. The method for producing the nonwoven according to claim 2, wherein the conventional physical vapor deposition processes uses (i) evaporation, or uses (ii) sputtering, or uses (iii) ion plating, or uses (iv) ionized cluster beam deposition (ICBD).

34. The method for producing the nonwoven according to claim 10, wherein the first metal alloy(s) of step a) are selected from at least one of the group consisting of palladium-indium-iron alloys, titanium-palladium-iron alloys, palladium-manganese-indium alloys, praseodymium-calcium-manganate alloys, praseodymium-lanthanum-calcium-manganate alloys, lanthanum-calcium-manganate alloys, lanthanum-barium-manganate alloys, barium-yttrium-copper-tungsten alloys and copper-samarium-tungsten alloys.

35. The method for producing the nonwoven according to claim 10, wherein the first metal alloy(s) of step a) are selected from at least one of the group consisting of $Co_{68.7}Fe_4Ni_1B_{13}Si_{11}Mo_{2.3}$, $Nd_3Fe_{68-x}Mn_xCo_{18}B_{11}$ (x=0, 1, 2), $CoFe_2$, $Pd_{57}In_{25}Fe_{18}$, and $Pd_{56.2}In_{26.3}Fe_{17.5}$, $Ti_{50}Pd_{40}Fe_{10}$, $Ti_{50}Pd_{40}Fe_{10}$, $Pd_2MnIn$, $InPO_3$, $Pr_{0.7}Ca_{0.3}MnO_3$, $La_{0.7}Ca_{0.3}MnO_3$, $Nd_{0.5}Pb_{0.5}MnO_3$, $La_{2/3}Ba_{1/3}MnO_3$, $B_2CuO_2$, FeNiMo, $Fe_{85}Si_{3.5}Al_{5.5}Cr_6$, and FeMnW ($P_{0.5}Ge_{0.1}Pb_{0.4}W_{0.2}$).

36. The method for producing the nonwoven according to claim 11, wherein the second metal alloy(s) of step c) are selected from at least one of the group consisting of nickel-manganese-tin alloys, nickel-manganese-gallium alloys, iron-manganese-silicon alloys, and silver-magnesium alloys.

37. The method for producing the nonwoven according to claim 11, wherein the second metal alloy(s) of step c) are selected from at least one of the group consisting of $Ni_2Mn_{1.44}Sn_{0.56}$, and $Ni_2Mn_{1.42}Sn_{0.58}$, $Ni_2MnGa$, FeMnSi, $Fe_{57.4}Mn_{35}Si_{7.6}$, $Fe_{66.7}Mn_{28.8}Si_{6.5}$, FeMnW ($P_{0.5}Ge_{0.1}Pb_{0.4}W_{0.2}$), and Ag—$MgF_2$—Ag.

38. The method for producing the nonwoven according to claim 13, wherein the material which improves the temperature stability of the polymer material is selected from at least one of glass, ceramics, porcelain, and graphene.

39. The method for producing the nonwoven according to claim 1, wherein the polymer material of step b) is selected from at least one of the list consisting of polyethylene terephthalate (PET), poly(p-phenylene therephthalamide) (PPTA), and poly(m-phenylene isophthalamide) (PMPI).

* * * * *

UNITED STATES PATENT AND TRADEMARK OFFICE
CERTIFICATE OF CORRECTION

PATENT NO. : 11,647,620 B2
APPLICATION NO. : 16/644584
DATED : May 9, 2023
INVENTOR(S) : Edgar-Johannes Van Hattum Page 1 of 1

It is certified that error appears in the above-identified patent and that said Letters Patent is hereby corrected as shown below:

On the Title Page

Change "(71) Applicant: SZE HagenukGmbH" to --(71) Applicant: SZE Spezial Elektronik Hagenuk GmbH--

Change "(73) Assignee: ZE HagenukGmbH" to --(73) Assignee: SZE Spezial Elektronik Hagenuk GmbH--

Signed and Sealed this
Twenty-seventh Day of August, 2024

Katherine Kelly Vidal
*Director of the United States Patent and Trademark Office*